United States Patent [19]

Bruchhaus et al.

[11] Patent Number: 5,403,752

[45] Date of Patent: Apr. 4, 1995

[54] METHOD FOR MANUFACTURING A PYRODETECTOR APPARATUS

[75] Inventors: Rainer Bruchhaus; Volker Lehmann, both of Munich, Germany

[73] Assignee: Siemens Aktiengesellschaft, Munich, Germany

[21] Appl. No.: 242,243

[22] Filed: May 13, 1994

[30] Foreign Application Priority Data

May 19, 1993 [DE] Germany ............... 43 16 853.1

[51] Int. Cl.[6] ............... H01L 21/306; H01L 21/76
[52] U.S. Cl. ............... 437/3; 204/129.3; 250/338.3; 257/467
[58] Field of Search ............... 437/3; 250/338.3, 338.4; 257/467, 522, 619; 204/192.37, 129.3

[56] References Cited

U.S. PATENT DOCUMENTS

| | | | |
|---|---|---|---|
| 3,801,949 | 4/1974 | Larrabee | 257/467 |
| 4,417,946 | 11/1983 | Bohlen et al. | 156/643 |
| 4,575,631 | 3/1986 | Satchell | 250/338.3 |
| 4,867,850 | 9/1989 | Oka et al. | 250/338.3 |
| 4,874,484 | 10/1989 | Foell et al. | 204/129.3 |
| 4,983,839 | 1/1991 | Deb | 250/338.3 |
| 5,286,975 | 2/1994 | Ogura et al. | 250/338.3 |
| 5,293,041 | 3/1994 | Kruse, Jr. | 250/338.3 |

FOREIGN PATENT DOCUMENTS

| | | |
|---|---|---|
| 0296348 | 12/1988 | European Pat. Off. . |
| 2917654 | 11/1980 | Germany . |
| 4000496A1 | 2/1991 | Germany . |
| 4003472A1 | 4/1991 | Germany . |
| 4036895A1 | 5/1992 | Germany . |
| 2156149A | 10/1985 | United Kingdom . |

OTHER PUBLICATIONS

R. W. Whatmore, "Pyroelectric Ceramics and Devices", Chapter 7, *Electronic Ceramics*, ed. by B. C. H. Steele, Elsevier, London and New York, pp. 169–184 (1991).

A. Patel et al., "Pyroelectric Properties of Lead Based Ferroelectric Thin Films", Ferroelectric Thin Films III, ed. by E. R. Myers et al., Materials Research Soc. Proc., vol. 310, Pittsburg, pp. 53–58 (1992).

Patent Abstracts of Japan, "Pyroelectric Type Infrared Detector," pub. Aug. 29, 1986, P-358, Jan. 21, 1987, vol. 11, No. 22., Akira Kaneko.

Patent Abstracts of Japan, "Infrared Laser Sensor," pub. Jun. 17, 1987, P-639, Nov. 21, 1987, vol. 11, No. 358 K. Mikami.

Eddoes, M. J.: "Photoelectrochemical Etching of Three–Dimensional Structures in Silicon," J. Electrochem. Soc., vol. 137, No. 11, Nov. 1990, pp. 3514–3516.

Polla, D. L.: "Surface–micromachined PbTiO$_3$ pyroelectric detectors," Appl. Phys. Lett. 59, Dec. 30, 1991, pp. 3539–3541.

*Primary Examiner*—George Fourson
*Assistant Examiner*—Thomas G. Bilodeau
*Attorney, Agent, or Firm*—Hill Steadman & Simpson

[57] ABSTRACT

A method for manufacturing a pyrodetector apparatus having hole structures produced by electrochemical etching in a first principal face of a substrate of n-doped, monocrystalline silicon, so that a structured region arises in the substrate. At least one pyrodetector element is arranged on the first principal face above the structured region.

25 Claims, 2 Drawing Sheets

METHOD FOR MANUFACTURING A PYRODETECTOR APPARATUS

BACKGROUND OF THE INVENTION

1. Field of the Invention

The present invention generally relates to pyrodetectors and more specifically to a method for manufacturing a pyrodetector apparatus.

2. Description of the Related Art

In the manufacture of integrated pyrodetector apparatus, individual pyrodetector elements are constructed on a substrate. Dependent on the employment, the pyrodetector apparatus encompasses four 256×256 or even more pyrodetector elements.

Substrates having low thermal conduction and low heat capacity are required for manufacturing integrated pyrodetectors to assure a sensitive response of the pyrodetector apparatus.

For constructing an integrated pyrodetector apparatus, it is known to employ a substrate of silicon whose surface is provided with a thin membrane of silicon oxide and silicon nitride. Proceeding from the back side, a depression is etched into the substrate within which the membrane of silicon oxide and silicon nitride is uncovered. The membrane spans the depression. The pyrodetector elements are constructed on the surface of the membrane. This method is not suitable for large-area pyrodetector apparatus because the membranes do not have the necessary mechanical stability. Another known method provides for constructing thin membranes at supporting points having a slight distance (approximately 1 $\mu$m) from the substrate surface. The electrodes and pyro-active layer are then applied thereon. This method is known under the name of Surface-Micromachining (see, for example, D. L. Polla et al., Appl. Phys. Lett. 59, pages 3539–3541 (1991)).

SUMMARY OF THE INVENTION

It is an object of the present invention to provide a method for manufacturing a pyrodetector apparatus with which it is possible to also manufacture a large-area pyrodetector apparatus having adequate mechanical stability.

The objects are inventively achieved in a method for manufacturing a pyrodetector apparatus, having the steps of forming hole structures in a substrate wafer of n-doped, monocrystalline silicon by electrochemical etching a first surface to produce a structured region in the substrate; and applying at least one pyrodetector element above the structured region of the first surface.

According to the invention, the pyrodetector apparatus, which has at least one pyrodetector element, is provided on a substrate of silicon that has at least one region structured by electrochemical etching. Hole structures are produced in the substrate by electrochemical etching in an electrolyte such that the substrate of n-doped, monocrystalline silicon is connected as anode, a first principal face of the substrate is in contact with the electrolyte, and a current density that influences the etching erosion is set.

Since the substrate is connected as anode in the electrochemical etching, minority charge carriers in the n-doped silicon move to the first principal face that is in contact with the electrolyte. A space charge zone forms at this first principal face. Since the electrical field strength in the region of depressions in the surface is greater than beyond these depressions, the minority charge carriers move to these points with priority. A structuring of the first principal face arises as a result thereof. More minority charge carriers move to an irregularity the deeper an initially small irregularity becomes due to the electrochemical etching because of the increased electrical field strength thereat. The etching attack at this location is therefore greater. Hole structures that grow in the crystallographic (100) direction in the substrate thereby arise. It is therefore advantageous to employ a substrate having (100) orientation.

The electrochemical etching of n-doped silicon for producing holes or trenches is disclosed, for example, by EP 0 296 348 wherein trenches are manufactured in this way, particularly for DRAM cells. The use of electrochemical etching in the manufacture of pyrodetector apparatus is not taken into consideration therein.

A structured region is produced by electrochemical etching in the substrate on which the pyrodetector apparatus is constructed in the method of the invention. This structured region has a low thermal mass and a low thermal conductivity because of the hole structures. It is nonetheless adequately mechanically stable, so that pyrodetector elements that, in particular, can each be respectively composed of a lower electrode, a pyro-active layer and an upper electrode and can be arranged at the surface of the structured region. In particular, a pyrodetector apparatus having a size of 256×256, preferably has 8×8 pyrodetector elements manufactured with the method of the invention.

The present invention provides for reading out the individual pyrodetector elements at the first principal surface of the substrate using a read-out circuit. The read-out circuit can be located both above the structured region as well as outside the structured region.

The electrochemical etching preferably occurs in an acidic, fluoride-containing electrolyte. The etching attack is thereby dependent on the current density in the substrate wafer and on the fluoride concentration in the electrolyte. By increasing the current density in the electrolyte or by reducing the fluoride concentration in the electrolyte, the etching attack is increased.

For setting the current density, the method of the present invention provides for illuminating the substrate proceeding from a second principal surface that lies opposite the first principal surface.

The method of the present invention provides a surface topology for the first principal face before the electrochemical etching. In this way, designational depressions are produced in the first principal face at which the etching attack begins during the electrochemical etching. The arrangement of the hole structures is thereby prescribed. The surface topology is produced, for example, by production of a photoresist mask and subsequent alkaline etching.

In order to further reduce thermal conduction between the structured region and the remaining part of the substrate, the method of the invention provides for etching a depression into the second principal face of the substrate lying opposite the first principal face before the electrochemical etching. The depression is arranged under the structured region. The depression has an expanse parallel to the first principal face which is at least as great as that of the structured region. In this way, the expanse of the structured region perpendicularly relative to the first principal face is set to preferably 10–100 $\mu$m.

According to another embodiment of the invention, the thermal conduction between the structured region and the remaining substrate is reduced in that a network of cavities is formed in the lower region of the hole structures, whereby the diameter of the cavities is greater than the diameter of the hole structures in the upper region. To that end, the process parameters in the electrochemical etching are varied such that when a prescribed depth of the hole structures is reached that the cross section of the hole structures increases. Since, as stated above, the etching attack occurs only in the lower region of the hole structures, the cross section of the hole structures in the upper region, i.e. in the proximity of the first principal face, thereby remains unaltered. In the lower region, however, the hole structures grow. This growth in the cross section of the hole structures occurs by increasing the current density in the electrolyte. The increase in the current density is effected by varying the illumination proceeding from the back side of the substrate or by reducing the concentration of the fluoride in the electrolyte.

The hole structures are preferably produced with a center-to-center spacing of 1–2 μm. In the region of the first principal face, the hole structures preferably have a diameter of 0.2–1 μm. They are thereby produced to a depth of, preferably, 1–30 μm. The cavities in the lower region of the hole structures are produced with a diameter of, preferably 0.5–1.8 μm.

The thermal conduction into the remaining substrate can be even more greatly reduced in this embodiment by oxidizing the surface of the cavities.

According to another embodiment of the invention, the thermal conduction between the structured region and the remaining substrate is reduced so that a large-area cavity is produced under the hole structures. Also, supports of silicon that proceed to the first principal face run perpendicularly through this large-area cavity. To this end, the hole structures in the structured region are produced with a non-uniform distribution in the first principal face, The non-uniform distribution is partially prescribed by a surface topology produced in the first principal face, In the electrochemical etching, the process parameters are then modified such that when a prescribed depth of the hole structures is reached—this essentially corresponding to the depth of the structured region—that the cross section of the holes grows, The etching is continued until hole structures neighboring one another in regions of higher density of the hole structures grow together upon formation of the cavity. In regions having a lower density of the hole structures, a support of silicon thereby remains between neighboring hole structures.

The supports of silicon are preferably arranged such that the pyrodetector elements need not be arranged above the supports. In order to achieve an adequate mechanical stability of the pyrodetector apparatus, it is advantageous to provide the supports of silicon at a spacing of 100–500 μm.

For manufacturing the cavity, the method of the invention provides for increasing the current density in the electrolyte or reducing the concentration of the fluoride in the electrolyte. For increasing the current density in the electrolyte, the illumination through the second principal face of the substrate is preferably modified.

The invention shall be set forth in greater detail below with reference to the figures and to the exemplary embodiments.

DETAILED DESCRIPTION OF THE PREFERRED EMBODIMENTS

Figure 1:
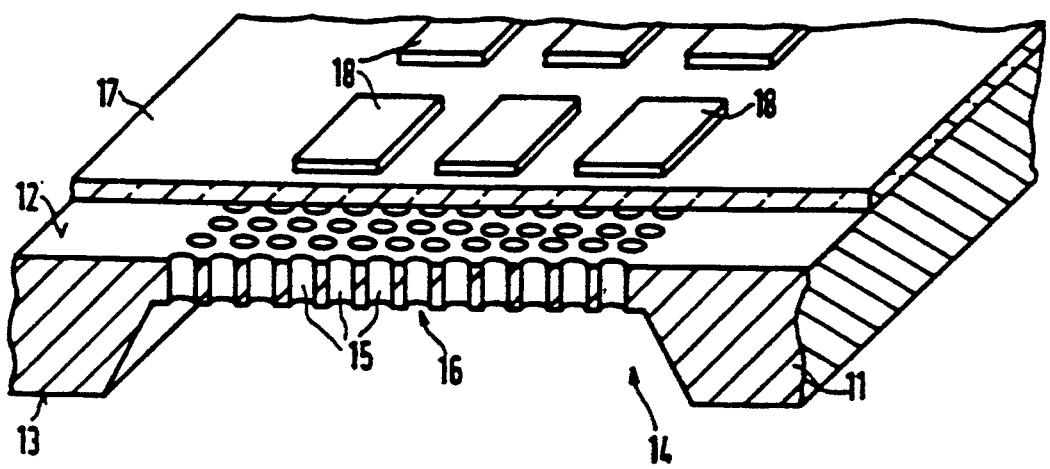
FIG. 1 shows a pyrodetector apparatus of the present invention wherein a structured region is arranged above a depression.
Figure 2:
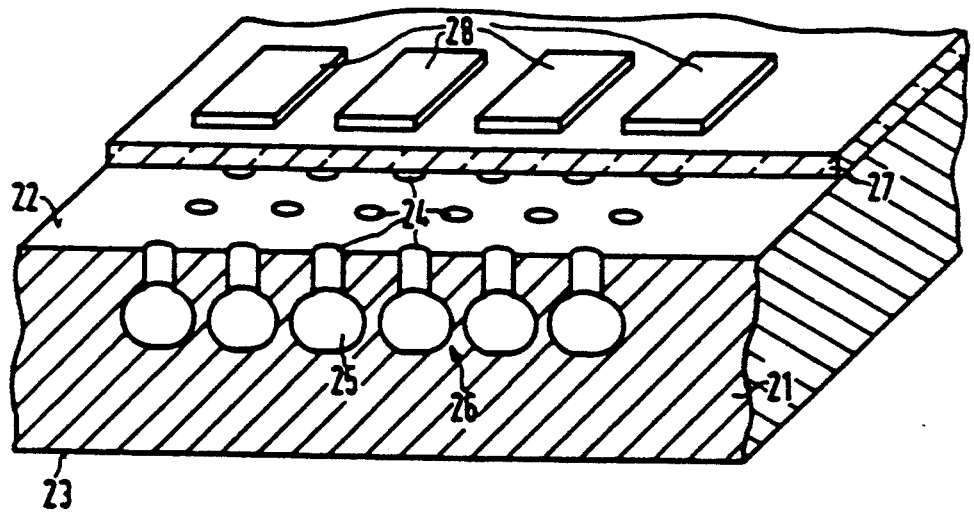
FIG. 2 shows a pyrodetector apparatus of the present invention wherein hole structures in a structured region have cavities in the lower part thereof.

A substrate 11 of n-doped, monocrystalline silicon that has a first principal face 12 and a second principal face 13 lying opposite the first principal face 12 is provided with a depression 14 proceeding from the second principal face 13 (FIG. 1). The substrate 11 has an electrical impedance of, for example, 5 Ω-cm. The depression 14 is produced, for example, by applying a photoresist mask (not shown) onto the second principal face 13 and implementing an alkaline etching.

Subsequently, hole structures 15 in the region above the depression 14 are produced proceeding from the first principal face 12. To that end, the substrate 11 is brought into contact with a fluoride-containing, acidic electrolyte with its first principal face 12. The electrolyte has a hydrofluoric acid concentration of, for example, 1–50%, preferably 3%. An oxidation agent, for example hydrogen peroxide can be added to the electrolyte in order to prevent the formation of hydrogen bubbles at the first principal face 12.

The substrate 11 is connected as anode. A voltage of, for example, 0–20 V, preferably 3 V, is applied to the substrate 11 and to the electrolyte. The substrate 11 is illuminated with light proceeding from the second principal face 13, so that a current density of, for example, 10 mA/cm$^2$ is set. Proceeding from irregularities in the first principal face 12, hole structures 15 are thereby produced that proceed perpendicularly relative to the first principal face 12. The electrochemical etching is continued until the hole structures 15 above the depression 14 permeate the entire substrate 11. A structured region 16 that has the hole structures 15 and is arranged above the depression 14 arises in this way.

A planar layer 17 is applied surface-wide on the first principal face 12. The planar layer 17 is composed, for example, of SiO$_2$. It is applied, for example, by oxidation or by sputtering. The planar layer 17 closes the hole structures 15 proceeding from the first principal face 12. Pyrodetector elements 18, each of which has a lower electrode, a pyro-active layer and an upper electrode, are applied onto the planar layer 17 above the structured region 16. For example, 8 pyrodetectors 18 are applied. The lower electrode is, for example, platinum; the pyro-active layer is, for example, lead titanate or a suitably doped lead titanate, and the upper electrode is, for example, nickel or chromium nickel.

As a result of the hole structures 15, the structured region 16 has a low thermal mass and low thermal conductivity. Also, the thermal conduction between the structured region 16 and the remaining part of the substrate 11 is reduced by the depression 14. It is therefore important that all of the pyrodetector elements 18 be arranged above the structured region 16.

The distribution of the hole structures 15 in the first principal face 12 can be prescribed by a topology with which the first principal face 12 is provided before the electrochemical etching. That region of the first principal face 12 in which the hole structures 15 are produced is defined, for example, by a photoresist mask that is applied before the electrochemical etching. This photoresist mask is removed after the production of the hole structures 15.

In an embodiment, the initial material is a substrate 21 having a first principal face 22 and a second principal face 23 that lies opposite the first principal face 22. The substrate 21 is composed of n-doped, monocrystalline silicon and has, for example, a (100) orientation.

A photoresist mask (not shown) is applied onto the first surface 22. This photoresist mask leaves only a part of the first principal face 22 uncovered, wherein hole structures 24 are subsequently produced.

In that part of the first principal face 22 not covered by the photoresist mask, the first principal face 22 has a surface topology that has, for example, regularly arranged depressions. This surface topology defines the distribution of the hole structures 24.

The first principal face 22 is brought into contact with an electrolyte. The electrolyte contains fluoride and is acidic. In an embodiment, the electrolyte contains a hydrofluoric acid concentration of, for example, 1–50%, preferably 3%. An oxidation agent, for example hydrogen peroxide can be added to the electrolyte in order to suppress the formation of hydrogen bubbles on the first principal face 22. The substrate 21 is connected as anode. A voltage of 0–20 V, preferably 3 V, is applied between the substrate 21 and the electrolyte. The substrate 21 is illuminated with light proceeding from the second principal face 23, so that a current density of, for example, 10 mA/cm$^2$ is set. The hole structures 24 that proceed perpendicularly relative to the first principal face 22 are generated in the electrochemical etching proceeding from the depressions.

The hole structures 24 are produced in a depth of, for example, 1–30 $\mu$m, preferably 15 $\mu$m. A depth of 30 $\mu$m is achieved after approximately 60 minutes etching time with the above-recited process parameters.

After this depth is reached, the anodic current density is increased, for example, to 30 mA/cm$^2$. The voltage between the electrolyte and the substrate 21 is thereby reduced to 2 V. The current density continues to be set by illumination of the second principal face of the substrate 21.

The cross sections of the hole structures 24 enlarge due to the modified process parameters in the electrochemical etching. A formation of cavities 25, each respectively arranged in the lower region of the hole structures 24 results. The electrochemical etching is continued until the cavities 25 have a diameter of, for example, 0.5 $\mu$m. This is the case after approximately 10 minutes.

In the upper region, the hole structures have a diameter of, for example, 0.2 $\mu$m. The center-to-center spacing of neighboring hole structures 24 is, for example, somewhat more than 1 $\mu$m.

The hole structures 24 and the cavities 25 form a structured region 26 of the substrate 21. The cavities 25 thereby provide a far-reaching, thermal insulation relative to the substrate 21 lying therebelow.

A planar layer 27 is applied onto the first principal face 22. The planar layer 27 closes the hole structures 24. The planar layer 27 is, for example, SiO$_2$ and is produced by oxidation or sputtering. Pyrodetector elements 28 are applied onto the planar layer 27 above the structured region 26. The pyrodetector elements 28 each have a lower electrode of, for example, platinum, a pyro-active layer of, for example, lead titanate or modified lead titanate, and an upper electrode composed of, for example, nickel or chromium nickel. The modified lead titanate that can be used for the pyroaction layer is known in the art as lead titanate that is modified by the addition of a dopant, see R. W. Whatmore, "Pyroelectric Ceramics and Devices", Chapter 7, *Electronic Ceramics*, ed. by B. C. H. Steele, Elsevier, London and New York, pp. 169–184 (1991) and A. Patel et al., "Pyroelectric Properties of Lead Based Ferroelectric Thin Films", Ferroelectric Thin Films III, ed. by E. R. Myers et al., Materials Research Soc. Proc., Vol. 310, Pittsburg, pp. 53–58 (1992). The pyrodetector elements 28 are arranged exclusively above the structured region 26.

In this embodiment, the thermal conduction from the structured region 26 into the remaining part of the substrate 21 can be reduced even more by oxidation of the surface of the cavities 25.

Figure 3:
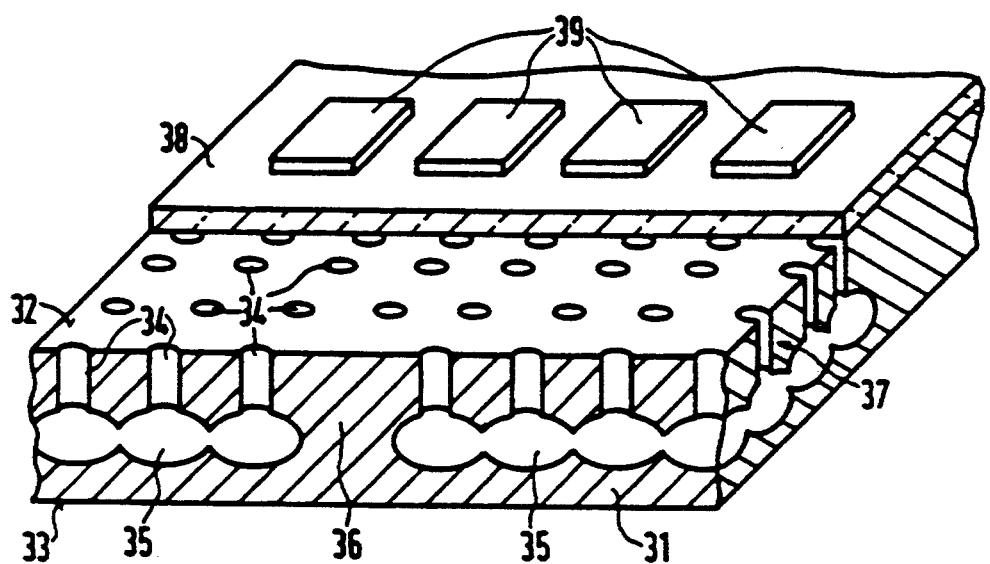
FIG. 3 shows a pyrodetector apparatus of the present invention having a structured region that has hole structures arranged above a large-area cavity.

In an embodiment, a substrate 31 of monocrystalline n-doped silicon is used as the initial material. The substrate has a first principal face 32 and a second principal face 33. The second principal face 33 lies opposite the first principal face 32 (see FIG. 3). The substrate 31 has a resistivity of, for example, 5 $\Omega$-cm. The first principal face 32 is provided with a surface topology that has depressions arranged on the first principal face 32 with non-uniform density.

For producing the hole structures 24, the first principal face 32 is brought into contact with a fluoride-containing, acidic electrolyte. The electrolyte has a hydrofluoric acid concentration of, for example, 1–50%, preferably 3%. An oxidation agent, for example hydrogen peroxide, can be added to the electrolyte in order to suppress the formation of hydrogen bubbles at the first principal face 31.

The substrate 31 is connected as anode. A voltage of 0–20 V, preferably 3 V, is applied between the substrate 31 and the electrolyte. The substrate 31 is illuminated with light proceeding from the second principal face 33, so that a current density of, for example, 10 mA/cm$^2$ is set. Proceeding from the depressions of the surface topology, hole structures 34 that proceed perpendicularly relative to the first principal face 32 are generated in the electrochemical etching. The hole structures have a diameter of, for example, 0.2 $\mu$m. When the hole structures 34 reach a depth of 1 $\mu$m, the etching parameters are modified. The anodic current density is increased, for example, to 30 mA/cm$^2$. The voltage between electrolyte and substrate 31 is thereby reduced to 2 V. The current density continues to be set by illuminating the second principal face 33 of the substrate 31.

Due to the modified parameters in the electrochemical etching, the cross sections of the hole structures 34 enlarge in the lower region given continued etching. Cavity-shaped expansions form at the floor of the hole structures 34. The etching is continued until the silicon separating neighboring, cavity-shaped expansions is etched off in regions wherein the hole structures 34 have a high density in the first principal face 32 and a large-area cavity 35 arises. A support 36 that proceeds from the first principal face 32 up to the second principal face 33 part of the substrate 31 remains between neighboring hole structures 34 in regions where the hole structures 34 have a lower density in the surface distribution. The structured region 37 of the substrate 31 formed by the hole structures 34 is firmly connected to the remaining part of the substrate 31 via these supports 36. The cavity 35 extends under the hole structures 34 over the entire structured region 37 and is only interrupted by the supports 36. In order to assure an adequate mechanical stability of the apparatus, the supports 36 are arranged at a spacing of, for example, 100–500 μm.

A planar layer 38 that closes the hole structures is applied onto the first principal face 32. The planar layer 38 of, for example, $SiO_2$ is produced by oxidation or sputtering. Pyrodetector elements 39 are applied onto the surface of the planar layer 38; each of these pyrodetector elements 39 has a lower electrode of platinum, a pyroelectric layer of, for example, lead titanate or modified lead titanate, and an upper electrode of, for example, nickel or chromium nickel. For example, 8 pyrodetector elements are applied.

The pyrodetector elements 39 are preferably arranged such on the planar layer 38 that the supports 36 in the substrate 31 are arranged between neighboring pyrodetector elements 39. All pyrodetector elements 39 are similarly applied, thermally insulated in this way.

Although other modifications and changes may be suggested by those skilled in the art, it is the intention of the inventors to embody within the patent warranted hereon all changes and modifications as reasonably and properly come within the scope of their contribution to the art.

We claim:

1. A method for manufacturing a pyrodetector apparatus, comprising the steps of:
    forming hole structures in a substrate wafer of n-doped, monocrystalline silicon by electrochemical etching a first surface opposite a second surface, to produce a structured region in said substrate; and
    applying at least one pyrodetector element above said structured region of said first surface.

2. The method of claim 1, wherein said etching is further defined by performing said electrochemical etching in a fluoride-containing, acidic electrolyte.

3. The method of to claim 1, wherein the step of forming hole structures in a substrate wafer is further defined by forming hole structures in a (100) wafer.

4. The method of claim 1 comprising the additional step of:
    providing said first surface with a surface topology before said electrochemical etching, said surface topology defining an arrangement of said hole structures.

5. The method of claim 1, wherein said step of forming hole structures is further defined by implementing said electrochemical etching in a fluoride-containing, acidic electrolyte with which said first surface is in contact and applying an electrical voltage between said electrolyte and said substrate wafer wherein said substrate wafer is connected as an anode; and setting a current density that influences the etching erosion in said substrate wafer.

6. The method according to claim 5, wherein said setting of said current density is further defined by illuminating the second surface that lies opposite said first surface of said substrate.

7. The method according to claim 5, wherein said etching is further defined by providing said electrolyte with 1–50% by weight hydrofluoric acid (HF).

8. The method according to claim 5, wherein said etching is further defined by performing said etching with said electrolyte additionally containing an oxidation agent.

9. The method according to claim 1, comprising the additional step of:
    etching a depression into said second surface before said electrochemical etching to reduce thermal conduction between said structured region and the remaining part of said substrate, said depression being oriented under said structured region and having an expanse parallel to said first surface and said expanse being at least as large as that of said structured region in the same direction as the expanse.

10. The method according to claim 9, said method being further defined by producing said depression in such a depth that said structured region comprises a depth of 10–100 μm perpendicularly relative to said first surface.

11. The method according to claim 7, comprising the additional step of:
    modifying process parameters in said electrochemical etching when said hole structures attain a first depth so that the cross section of said hole structures grows, so that a network of cavities occurs in the lower region of said hole structures.

12. The method according to claim 11, wherein said modifying step is further defined by increasing said current density in said electrolyte.

13. The method according to claim 11, wherein said etching is further defined by performing said electrochemical etching in a fluoride containing acidic electrolyte, and said modifying step is further defined by reducing said concentration of fluoride in said electrolyte.

14. The method according to claim 11, comprising the additional step of:
    oxidizing said surface of said cavities.

15. The method according to claim 11, said method being further defined by generating said hole structures having a center-to-center spacing of 1–2 μm, a depth of 1–30 μm, and a diameter of 0.2–1 μm in the region of said first surface; and producing said cavities having a diameter of 0.5–1.8 μm.

16. The method according to claim 1, comprising the additional steps of:
    producing said hole structures in said structured region with a non-uniform distribution in said first surface; and
    modifying process parameters in said electrochemical etching when said hole structures attain a first depth such that a cross section of said hole structures increases so that neighboring hole structures in regions of higher density of said hole structures grow together upon formation of a cavity and supports of silicon remain between neighboring hole structures in regions of lower density of said hole structures.

17. The method according to claim 16, said modifying step being further defined by increasing said current density in said electrolyte.

18. The method according to claim 16, said etching is further defined by performing said electrochemical etching in a fluoride containing acidic electrolyte, and said modifying step being further defined by reducing said concentration of fluoride in said electrolyte.

19. The method according to claim 16, comprising the additional step of:
    laterally applying said pyrodetector elements relative to said supports.

20. The method according to claim 1, comprising the additional steps of:
  providing said first surface of said structured region with a planar layer; and
  applying a lower electrode, a pyro-active layer and an upper electrode for said pyrodetector element on said surface.

21. The method according to claim 20, wherein said step of providing said surface of said structured region with a planar layer is further defined by providing said surface of said structured region with a planar layer formed of $SiO_2$, and said step of applying a lower electrode is further defined by providing a lower electrode formed of platinum.

22. The method according to claim 21, wherein said step of applying a pyro-active layer is further defined by providing a pyro-active layer formed of lead titanate.

23. The method according to claim 21, wherein said step of applying a pyro-active layer is further defined by providing a pyro-active layer formed of modified lead titanate.

24. The method according to claim 21, wherein said step of applying an upper electrode is further defined by providing a upper electrode formed of nickel.

25. The method according to claim 21, wherein said step of applying an upper electrode is further defined by providing a upper electrode formed of chromium nickel.

* * * * *